United States Patent [19]

Quadri

[11] 4,202,043
[45] May 6, 1980

[54] BUBBLE MEMORY DEFECT TOLERANT LOGIC CONTROL CIRCUIT

[75] Inventor: Farooq M. Quadri, San Diego, Calif.

[73] Assignee: Burroughs Corporation, Detroit, Mich.

[21] Appl. No.: 848,083

[22] Filed: Nov. 3, 1977

[51] Int. Cl.² ............................................. G11C 19/08
[52] U.S. Cl. ........................................ 365/15; 365/12
[58] Field of Search ...................................... 365/1, 15

[56] References Cited

U.S. PATENT DOCUMENTS

| | | | |
|---|---|---|---|
| 3,792,450 | 2/1974 | Bogar | 365/15 |
| 4,073,012 | 2/1978 | Ohnigian et al. | 365/15 |

OTHER PUBLICATIONS

IBM Technical Disclosure Bulletin—vol. 18, No. 9, Feb. 1976, pp. 3079-3081.

Primary Examiner—James W. Moffitt
Attorney, Agent, or Firm—Joseph R. Dwyer; Kevin R. Peterson

[57] ABSTRACT

A bubble memory system comprising data chips each having a plurality of storage loops and wherein each is provided with additional storage loops to compensate for defective loops in the chip, and a control chip having control loops, one loop for each data chip and with bit positions corresponding in number to the number of storage loops in the data chip and connected to the data chip to prevent defective loops on the data chips from being utilized. Thus, data chips which would otherwise have been discarded as defective can now be used.

5 Claims, 3 Drawing Figures

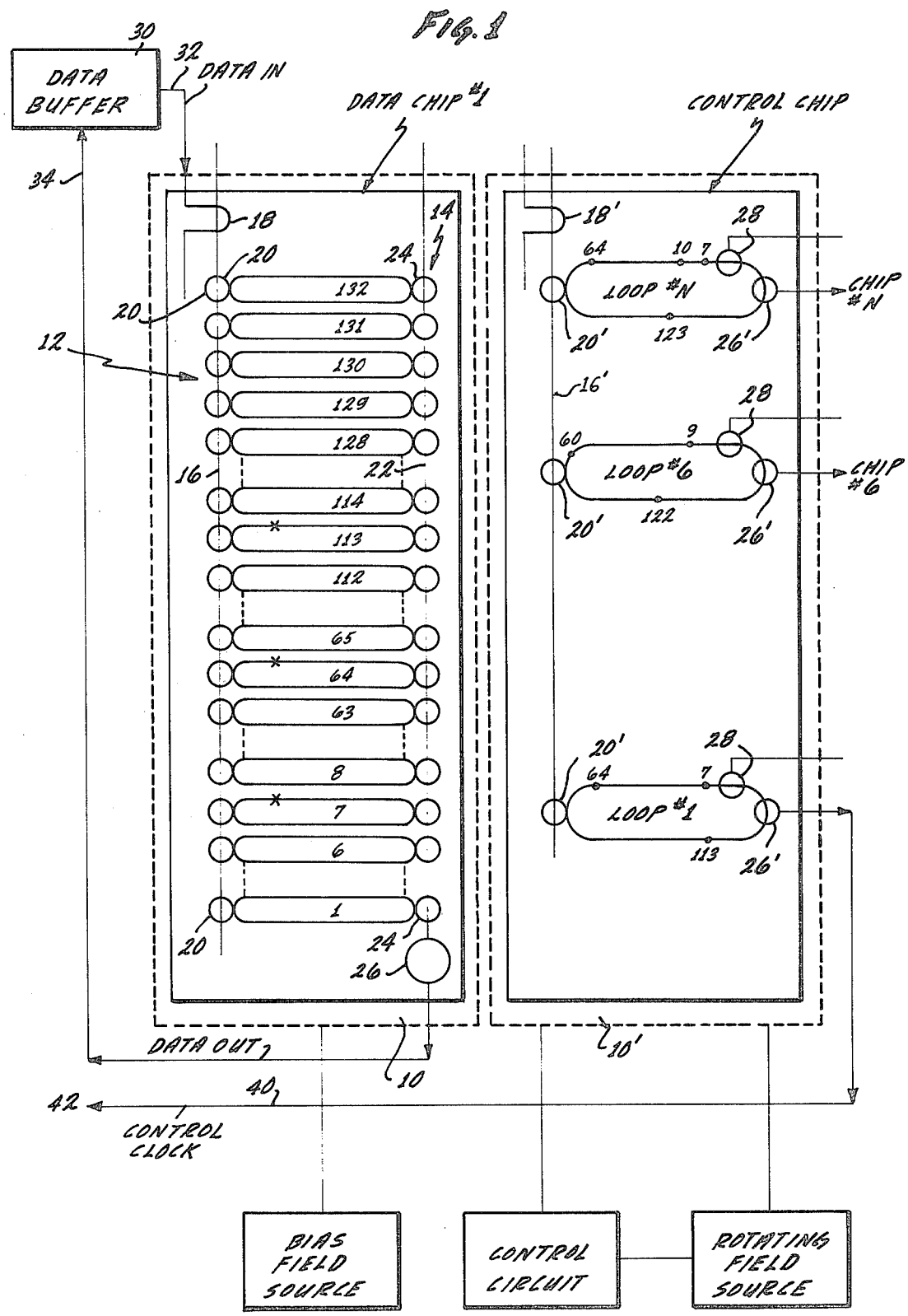

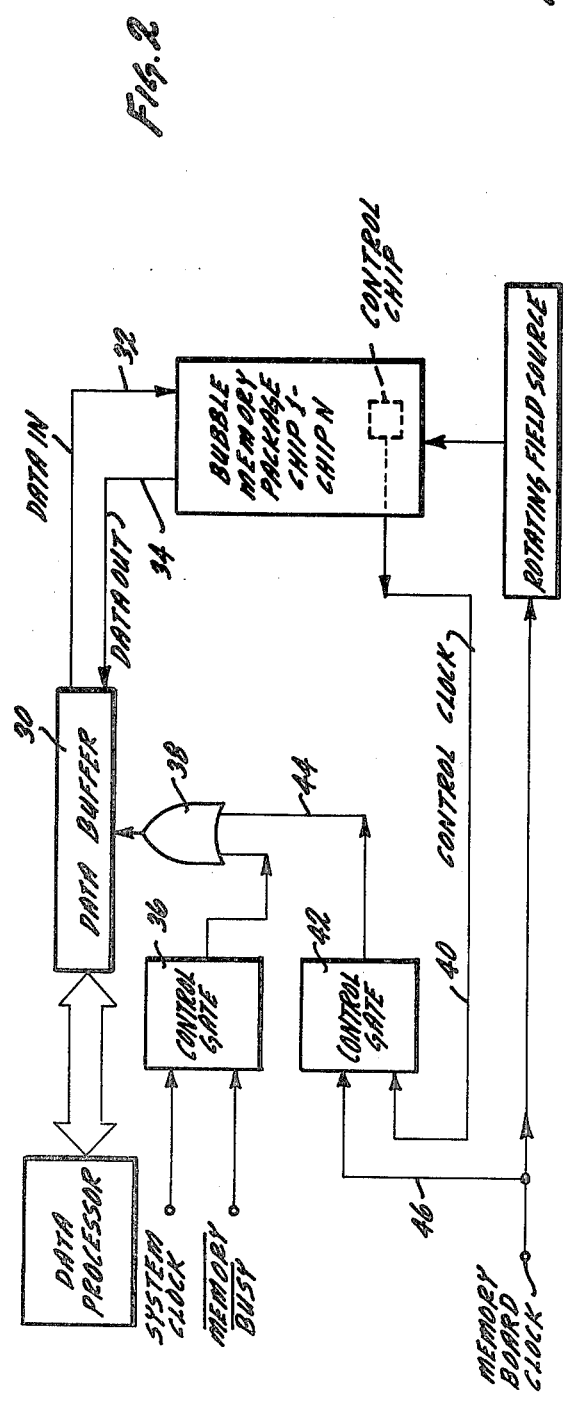

BUBBLE MEMORY DEFECT TOLERANT LOGIC CONTROL CIRCUIT

BACKGROUND OF THE INVENTION

1. Field of Invention

This invention relates to the field of bubble (magnetic domain) memories and in particular to the most efficient configuration of such memories to enable mass production thereof.

2. Prior Art

In order to make large mass memories of the bubble domain type practical, it must not only be compatible with other computer systems but also it must have mass production capabilities. This invention teaches how both of these goals can be realized.

As to the mass production capabilities in the manufacture of bubble memories, chips are formed on a large wafer containing a greater number of such chips, each of which contains a permalloy overlay pattern of magnetic elements which, together with the garnet bubble supporting film, provides means for propagating bubbles through the memory in response to a rotating in-plane magnetic field. Several forms of propagate elements together with bubble generators, replicators, annihilators, magnetoresistive detectors, etc., are now well known in the art. Also, one of the most popular organizations of these memories is a cluster of many storage loops served by one input and one output track. This not only improves access time but also makes redundant loops possible. The use of this redundancy will be clear hereinafter.

When such chips are formed on a wafer, usually by a photolithographic process with masks to define the configuration, for any number of reasons, one or more of the storage loops on a chip may be found to be defective. This means the defective storage loop is incapable of supporting one or more of the bubbles under the propagate elements; or stated another way, a number of bit positions on the storage loop is lost. This fault would introduce, of course, error into the memory and ordinarily would be a reason for rejecting an entire chip or perhaps a number of chips on a wafer. This large reject rate, of course, increases the cost of manufacture of chips.

There are a number of schemes, both in the patented art and in the literature, directed to solutions to this problem, i.e., means to tolerate defective loops on the chips and thus improve yield and reduce cost. Typical examples are the U.S. Pat. No. 3,909,810 to Naden, et al, and the article by the same inventor entitled, "Fault-Tolerant Memory Organization", appearing in the IEEE Journal Transactions on Magnetics, Vol. Mag-10 of September 1974, page 852, et seq.; the U.S. Pat. Nos. 4,001,673 to Barrett, et al; 3,990,058 to Archer, et al; 3,921,156 to Yoshimi; and 3,792,450 to Boger, et al.

The U.S. Pat. No. 3,909,810 to Naden, et al, shows a scheme in which a flag chip is utilized to prevent faulty loops on the data chips from being used for data storage but, on the other hand, this flag chip itself is used to store the data that would otherwise have been entered into the defective storage loop. This flag chip has a plurality of storage loops corresponding in number to the number of storage loops in the data chip and also uses a major loop for transferring data in and out of the loops of the flag chip. Thus, it, too, is subject to the same defect problem as the data chip since it, too, must be a perfect chip and is expensive for that reason. Also, in the organization therein disclosed, there is a time delay in getting the bubbles out of the flag chip which slows the overall system access time.

It is therefore an object of this invention to provide a defect tolerant memory organization which is simpler than the prior art organization and is thus less expensive and less subject to having defect problems.

SUMMARY OF THE INVENTION

The defect tolerant bubble memory organization of this invention which overcomes the deficiency of the prior art and meets the foregoing object takes a different approach to solving the problem.

First of all, the number of defective loops in a storage loop organization can be statistically forecast and for that reason each data chip is given an additional number of loops according to the forecast to compensate for the same number of possible defective loops on the data chip. These extra loops are provided even though actually there may be no defective storage loops on the chip in question. Thus, for example, in a chip which requires 128 storage loops, it is within the statistical probability that not more than four storage loops will be defective in that chip and, therefore, four additional storage loops are simply added to the 128 loops to meet this probability. These four additional storage loops are based on this statistical probability and, since the additional loops are simply a matter of adding them during the masking process, the fabrication of domain memories are then within mass production techniques. Part of the reason for this is that, in the masking process, if more than four are found to be defective, the mask itself should be changed to reduce the number of defective storage loops.

The second approach to solving the defective data chip problem is to provide a control chip for the memory package which has one large loop for each data chip which contains as many bit positions in each loop as there are storage loops in the data chip with which it is associated. This control chip is different from the prior art flag chips in that it does not store any data bits nor is it a minor-major loop configuration, but is simply a timing loop to control entry of data into the data chip storage loops by preventing the use of the defective storage loops and utilizing the additional loops for the storage of data directly on the data chip.

Thus, the memory organization of this invention comprises a plurality of data chips with one control chip, each data chip containing (n) more storage loops than are necessary for a selected word length (l) and the control chip contains a loop for each data chip having bit positions corresponding to the number of storage loops (l+n) in the associated data chip, one such loop for each data chip, all arranged in a circuit by which data can be entered and read from the data chip using the control chip to prevent the defective loop from being utilized. The memory organization is subject to a clock (in-plane rotating magnetic field), one cycle for each data bit or memory loop (i.e., 132 storage loops in the disclosed embodiment), but the data-in and data-out signal formed by the control loop corresponds to the number of bits in the selected data word (l=128 bits) and is thus less than the number of cycles in the chip clock.

BRIEF DESCRIPTION OF THE DRAWINGS

FIG. 1 is a diagram, partly in block form and partly in schematic form, of one data chip and a control chip employed in a bubble memory package in accordance with the present invention;

FIG. 2 is a schematic illustration of the circuitry employed together with a bubble memory package of FIG. 1 for interfacing with a data processing system in accordance with the present invention; and FIG. 3 is a timing diagram of the circuitry of FIGS. 1 and 2.

DESCRIPTION OF THE PREFERRED EMBODIMENT

Referring now to the drawings and first to FIG. 1, it can be seen that there is disclosed a storage bubble memory organization (data chip number 1) on which conditions exist for establishing single wall magnetic domains (bubbles) on suitable magnetic material such as an epitaxial magnetic garnet film on a nonmagnetic garnet substrate; all of which are referred to as 10 and are well known in the art. Patterns of magnetically soft overlay material forming propagate elements, such as T-bar, half disc, or contiguous disc elements, are used to form a series of identical storage loops (numbers 1–132 where $l=128$ and $n=4$) in a stacked or vertically aligned configuration with the major axes horizontal (as shown in the drawing) and with the ends of the loops located adjacent parallely disposed vertical Write-in means 12 and Read-out means 14.

Write-in means 12 comprises an input track 16, a generator 18 and a plurality of transfer-in gates 20 (one gate for each loop) and the read-out means 14 comprises an output path or track 22, replicator/transfer-out gates 24, one such gate for each loop, and a detector 26 for detecting the absence or presence of a domain at a particular time as they are being transferred serially therethrough in the conventional manner.

In this configuration, as an illustrated embodiment of the invention, only a few of the storage loops 1 through 132 are shown, with the dotted lines between the various loops indicating that additional storage loops are utilized, and each storage loop, with a predetermined number of propagate elements, and closes on itself so that circulating bubbles established in the loops, in time, circulate indefinitely in response to a rotating in-plane magnetic field, unless transferred out.

Also suitable bias sources, control circuits, including auxilliary circuits for the application of pulses to the generators, the transfer gates, annihilators, and an in-plane magnetic field source, which propagates the domains throughout the memory organization are well known, and shown herein schematically and in block diagrams.

The generator 18, located at the entrance at the input track, generates bubble domains to be transferred serially along the input track 16 and conventionally, using positive logic, for example, a bubble represents a binary "1" bit and the absence of a bubble represents a binary "0" bit and, of course, there is one bit position on the input track 16 and on the output track 22 for each storage loop.

Typically, the binary bits, whether domains or voids, are transferred along the input track 16, voids being developed by simply not pulsing the generator 18, and when the bits reach their respective positions opposite the entrance to a storage loop, a transfer-in pulse on the gates will transfer the bits into all storage loops. Thus, circulating in the storage loops are sets of bits forming a binary word of an arbitrary length (l) depending upon the system. In this disclosure (l) equals 128 bits to comprise a binary word length to synthesize the data chip with a 128-bit word of a data processing system.

Thus far described is a conventional storage loop organization forming one chip of a memory package without consideration of any defective loops and the means of compensating therefor—the problem to which this invention is directed.

Continuing with a description of FIG. 1, there is shown a control chip which is used in conjunction with each bubble memory package which control chip is subject to the same bias field, control circuits and rotating in-plane field source and is formed on a similar substrate 10' and comprises a plurality of control loops 1 through N the number of which will correspond to the number of data chips being used and are identified as control loop number 1—control loop number N (where $N=8$ in an 8 chip bubble memory package). These control loops, like the storage loops of the data chip, are arranged in columns and each contains a number of bit positions formed of selected propagate elements corresponding in number to the number of storage loops in each of the chips. Thus, in the organization shown there are 132 bit positions ($l+n=132$) in each control loop corresponding to the 132 storage loops in each of the data chips. Each control loop is dedicated to service, or function with, one data chip as, for example, loop number 1 is correlated to data chip number 1. Also, like the data chip, each control chip is provided with a generator 18' which generates bubble domains to be transferred serially along the input track 16' and, when the bubbles (or the absence of bubbles) reaches their respective positions opposite the entrance to the control loops, a transfer pulse on the gates 20' will transfer the domains in parallel into the control loops. Thus, circulating in the control loops are sets of bits (either bubbles or voids) which identify the respective storage loops in the associated data chip. This control chip differs, however, from the data chips in that there is a detector 26' for each of the loops so that each loop can produce a signal (a pulse or the absence of a pulse) as the bit passes through the detector. Also, each loop has its own annihilator 28 which functions to erase domains from each of the loops, if desired. (In this control chip the types of functional elements, such as generators, transfer-in gates, etc., are given the same reference numeral as in the data chip except that a ' is added).

Again, like the data chip, bits entered into their respective control loops, such as control loop number 1, will circulate indefinitely in response to this same rotating in-plane magnetic field as operating on data chip number 1, unless annihilated by its associated annihilator. Also in this arrangement, it is contemplated that, once a bit is entered into a control loop, the bit will remain therein indefinitely. However, it is possible that, under certain circumstances, it may be desireable to change a bubble memory package in the field, and the annihilator 28 and generator 18', associated with the control chip, will permit this to be done. This permits, for example, a bubble memory package having a chip which may become defective in the field to be corrected by changing its associated control loop in accordance with the teachings of this invention.

Referring again to the summary of the invention where it was stated that the statistical probability of a number of loops being defective depends upon the number of loops involved, e.g., in a 128 loop configuration (l=128), it is probable that not more than four loops (n=4) would be defective, attention is again directed to data chip number 1. In the embodiment, there are four additional storage loops 129-132, where n=4. This again, of course, corresponds to the number of bit positions in each of the control loops of the control chip. The purpose of the additional storage loops 129-132 is to compensate for the possibility of four storage loops being defective in the fabrication of the chip and the purpose of the control loops is to eliminate any defective storage loop from the function of the organization to prevent error in the processing of data in the bubble memory package. This also, of course, permits use of a data chip that would otherwise have to be discarded. How this is accomplished will now be described.

In FIG. 2 there is shown a bubble memory package for which the purpose of illustrating the invention contains eight data chips (N=8) including data chip number 1 and one control chip such as that shown in FIG. 1. The package is connected to a data buffer 30 by a pair of input and output conductor lines 32 and 34 and the data buffer is, in turn, connected to a data processor shown as a block diagram. In the operation of this invention, data is transferred in and out of the data buffer 30 according to a clocking system of the data processor which may be considerably faster than the clocking system of the bubble memory package and this same system clock is also shown connected to an input of a control gate 36, such as an AND gate, whose output is connected to an input of an OR gate 38. A second input of the control gate 36 is a Memory Busy signal which, while not shown, may be generated as soon as a read or write operation is indicated on a particular storage package so that the data buffer could work under two clocking systems. When the data buffer is loaded with data bits, from the data processor, a memory busy switch (not shown) will change state (go LOW as represented by the complement (Memory Busy), thus disabling the control gate 36 and preventing the system clock from controlling the data buffer 30. The reason for the disablement of the system clock is to permit the two systems, the data processing system and the bubble memory system, to operate at different clock frequencies.

Referring again to FIG. 1 in connection with FIG. 2, it can be seen that the detector output 26' of loop number 1 is connected by a conductor line 40 to one input of a second control gate 42 such as an AND gate whose output is connected to the OR gate 38 by conductor line 44. Also connected to a second input of the AND gate 42 is a memory board clock source connected thereto by conductor line 46. The memory board clock also clocks the rotating field source, the connection being shown by a line to the rotating field source similar to FIG. 1.

Thus, the bubble memory package and the data buffer 30, operate according to the frequency of the memory board clock when the system clock is disabled. It is to be noted that the output from the bubble memory package will have the same number of output pulses as the number of bit positions in the data buffer which, in this case, is 128 pulses, while the input to the bubble memory package along conductor 32 will have 132 pulses corresponding to the number of storage loops in the data chip, which in this embodiment, is 132. Again, it should be emphasized that since this is a defect tolerant organization in which there are (n) more storage loops than bit positions (l), a need for the control chip to change the 132 bit positions (storage loops) to 128 bits to and from the data buffer 38 becomes apparent.

Again returning to FIG. 1 and taking as an example, loop 1 of the control chip and the data chip number 1, it can be seen that loops 7, 64 and 113 of the data chip have been chosen to be defective simply for the purpose of illustration of this invention. The use of these defective loops is to be eliminated from the function of the chip.

Defective storage loops thus being identified, bit positions 7, 64 and 113 in loop number 1 are identified by voids in the bit positions (shown as dots in the loop for the sake of clarity) which means that, as bit number 7 passes under the detector 26' in that loop, a no pulse signal will be generated by the detector 26'. The same is true of bit positions 64 and 113 as they pass under the detector 26'.

Inasmuch as the detector 26' is connected to the control gate 42, the same no pulse signal is presented to the control gate at the same time pulse number 7 from the board clock and the seventh rotation of the rotating field source occurs. In the Write Mode, control gate 42 is disabled (one input being LOW) with the result that data is not clocked out of the buffer onto line 32 to generate a bubble so a void will occur at the appropriate time in line 16 of the data chip. On the next cycle of the board clock and the rotating field source, bit position number 8 will generate a pulse in detector 26' which will be presented to control gate 42 at the same time clock pulse number 8 is presented, enabling the control gate 42 to clock a bit out of the data buffer onto line 32 to generate a bubble which will be transported along the input line 16 of the data chip. In the Read Mode, data replicated and transported along output line 22 of chip number 1 will be sensed by the detector 26 and produce a pulse or a nopulse signal to be presented to the data buffer along line 34. Since the loop 1 is correlated in the same way as the Write Mode, at the time the void produced by the defective loop 7 not having a bubble which would otherwise be recognized as a binary "0", the output from the detector 26' also presents a no-pulse signal to the control gate 42 so that the input to the data buffer is disabled for one clock pulse, thus eliminating storage loop number 7 as an operative function in the system, yet distinguishing between a void, a defective loop and a void as a binary "0" by the operation of control gate 42 which controls the buffer when the system clock is disabled.

The foregoing description of a Read and Write Mode is more clearly seen in FIG. 3 where line 1 represents the board clock, line 2 represents the control clock, line 3 represents the storage loop number, line 4 represents the data and line 5 represents the bit number. In this timing diagram it can be seen that with the defective loops 7, 64 and 113 functionally eliminated, data that would normally be placed in loop 7 is placed in loop 8 and data normally placed in loop 64 is now placed in loop 65 and data normally placed in loop 113 is now placed in loop 114. It can be appreciated, however, that with the loss of three loops, bit number 111 is now in loop 114 and to accomodate this, three extra loops are utilized, loops 129, 130 and 131. Thus, while 132 pulses completed the entry or discharge of information to or from the data buffer, the word length remained 128 bits.

While the foregoing description of the Read and Write Mode is in terms of the control loop having an absence of a bubble to identify a defective loop and thus send a no-pulse signal from the detector 26', it is obvious that a bubble could be selected to identify a defective loop and the absence of a bubble identify the non-defective loops in which case the control circuit is modified by adding, for example, an inverter in line 40 to the control gate 42.

From the foregoing it can be seen that by adding a predictable number (n) of loops beyond the number (l) of required loops to correlate with a data processor, and by utilizing a control chip, data chips heretofore normally discarded can now be utilized thus decreasing the cost of bubble memory packages by increasing yield.

What is claimed is:

1. A bubble memory system having a rotating in-plane magnetic field for bubble propagation comprising:
   a data chip including bubble propagation track means,
   a plurality of storage loop means formed of propagate elements, some of which may be defective, for supporting bubble domains therein, a bubble or the absence of a bubble constituting bits of binary information circulating in said storage loop means in response to the rotation of said in-plane magnetic field.
   data chip transfer means for each storage loop means for transferring said bits to and from said storage loop means and to and from said track means, and
   detector means connected to said track means for serial detection of bits therein and generating a signal representing said bits; and
   a control chip comprising bubble propagation track means,
   control loop means formed of propagate elements for supporting bubble domains therein,
   control chip transfer means for said control loop means for transferring bubbles to said control loop means from said track means in a preselected order so as to identify defective storage loop means, if any,
   said control chip being operatively connected to said data chip but having its control transfer means independent of said data chip transfer means so that bits in said data chip do not enter said control loop means, and
   means connected to said control loop means for inhibiting identified defective loop means from contributing to the representation of said bits including detector means for the serial detection of bubbles circulating in said control loop means, a clock source having a same cyclical period as said rotating magnetic field, and means connected to said in-plane rotating magnetic field and to said clock source for preventing the transfer of bits into defective loop means and for identifying and eliminating any defective loop means positioned in the serial generation of bit signals by said detection means on said data chip.

2. The bubble memory system as claimed in claim 1 including a data buffer having bit positions for receiving and transferring out binary bits from a data processing system, a system clock source for clocking said binary bits in and out of said data buffer from said data processor, and means enabling and disabling said system clock source to enable said bubble memory system to transfer in and transfer out binary bits from said data buffer.

3. The bubble memory system as claimed in claim 2 wherein said data chip contains as many storage loops means as bit positions in said data buffer plus additional storage loop means to compensate for any defective loop means.

4. A magnetic domain memory system for receiving and sending binary words comprising:
   a data chip having a domain structure including magnetic elements disposed in an arrangement in which magnetic domains propagate in response to a rotating in-plane magnetic field.
   the arrangement including a predetermined number of storage loops having a predetermined number of magnetic elements on which domains circulate, said domains, or absence of said domains, on said magnetic elements in said storage loops representing bits of binary information;
   write-in means and read-out means disposed relative to said storage loops,
   said write-in means including means for generating bits and propagating said bits to positions adjacent said storage loops, one bit for each storage loop as a binary word, and means for transferring said binary word into said storage loops for storage therein,
   said read-out means including means for forming replicas of bits in said storage loops, means for transferring said replica bits one at a time, means for receiving and sensing said transferred replica bits; and
   a control chip having a domain propagation structure including magnetic elements disposed in an arrangement on which magnetic domains propagate in response to a rotating in-plane magnetic field;
   the arrangement including at least one control loop having a number of magnetic elements on which said domains circulate, one magnetic element for each storage loop in said data chip and wherein said domains, or the absence of said domains, on said magnetic elements in said control loop represents a defective storage loop in said data chip;
   write-in means disposed relative to said control loop, said write-in means including means for generating bits and propagating said bits to a position adjacent said control loop and means for transferring said bits into said control loop for storage therein; said write-in means on said control chip being independent of said write-in and read-out means on said data chip so that said binary words are not transferred to said control chip, and
   read-out means for sensing said domains in said control loop and inhibiting said identified defective loop in said data chip from contributing to the sending or binary words from said system on said storage loops by inhibiting operation of said generating means on said data chip at selected cycles of said rotating in-plane magnetic field to cause a bit of said binary word to skip one bit position adjacent the defective storage loop and go to the bit position adjacent the next non-defective storage loop, said read-out means also being connected to said means for receiving said replica bits for identifying a non-bit position in the word of replica bits and preventing said non-bit from being transferred out of said system.

5. The system as claimed in claim 4 wherein said read-out means on said control loop inhibits operation of said generating means on said data chip of a selected cycle of said rotating in-plane magnetic field to cause said generating means to generate a defective loop bit and to be transferred to a bit position adjacent a defective loop and to identify and inhibit the defective loop bit from becoming part of the binary word emanating from the system.

* * * * *